United States Patent [19]
Banfi

[11] 3,970,873
[45] July 20, 1976

[54] BISTABLE LOGIC CIRCUIT WITH IN-SERVICE TEST CAPABILITY

[75] Inventor: Antonio Banfi, Milan, Vimercate, Italy

[73] Assignee: Societa Italiana Elettronica S.p.A., Milan, Italy

[22] Filed: Jan. 2, 1975

[21] Appl. No.: 537,849

[30] Foreign Application Priority Data
Mar. 15, 1974 Italy.................................. 49300/74

[52] U.S. Cl............................... 307/276; 307/215; 307/247 R; 307/293
[51] Int. Cl.² ......................................... H03K 17/00
[58] Field of Search .......... 307/247, 270, 276, 215; 328/293, 196; 324/73 R

[56] References Cited
UNITED STATES PATENTS
| | | | |
|---|---|---|---|
| 3,833,853 | 9/1974 | Milford | 324/73 R |
| 3,870,953 | 3/1975 | Boatman et al. | 324/73 R |

Primary Examiner—Stanley D. Miller, Jr.
Assistant Examiner—B. P. Davis
Attorney, Agent, or Firm—Ostrolenk, Faber, Gerb & Soffen

[57] ABSTRACT

A bistable logic circuit generating a stable, preferred output logic state for activating a circuit load having a known response time and capable of being tested while installed and in service without activating the output load includes preferential output state logic memory means, asymmetric delay means and first logic means to generate an output which is the logic product of the memory output and the negation of the circuit Reset input. Second logic means generates the memory means control signal as the logic sum of the circuit Set input and the circuit output asymmetrically delayed by a time period less than the load response time. A test pulse output having a time duration less than the load response time is generated for a set input having a time duration less than one internally determined time period whereby the circuit load is not activated. A load activating output is generated at any time, including the test time period, for a Set input having a time duration greater then another internally determined time period and maintained until a Reset input is solely present.

11 Claims, 2 Drawing Figures

BISTABLE LOGIC CIRCUIT WITH IN-SERVICE TEST CAPABILITY

BACKGROUND OF THE INVENTION

This invention relates to bistable logic circuits and more particularly relates to a novel bistable logic circuit normally testable without generating spurious activating outputs while installed and in service in a logic system.

A bistable logic circuit is often used for storing transitory signals in a logic system. The circuit inputs are characterized as being either the low, or logic zero, or the high, or logic 1, state of a bit of binary information. The memory function associated with the storage of this binary logic information is often realized by a dual-control bistable multivibrator, referred to as a flip-flop. The switching of the memory output from a logic zero state to a logic one state, and vice-versa, is caused by the application of special control signals to appropriate input terminals of the memory circuit. Various circuit configurations are known which utilize a variety of control signals to establish the desired output of the basic bistable operator. In all of these circuits the output is characterized as being switched from a logic zero to a logic 1 by the application of a set-output signal to the circuit Set input terminal and by being switched from a logic 1 to a logic zero by the application of a reset-output signal to the circuit Reset input. When both the Set and Reset inputs are simultaneously applied the circuit may be designed to prefer the Set input, so that the output is always set as a logic 1. The opposite preference, i.e., the output always being set as a logic zero, can also be designed for the simultaneous application of both input signals.

In some applications of the bistable memory circuit, a series of important control interventions is initiated by the switching of the memory output from a state of normal operation, which may, for example, be a logic zero, to a state of control intervention, i.e. a logic 1. The reliability of the control intervention depends on the integrity of the memory circuit. A faulty memory circuit which will not properly switch the output to a logic 1 and maintain that output after the Set signal has ceased, will prevent the proper occurance of the control intervention.

Because the control intervention of the memory circuit is required for the safety of the system, it is desirable to be able to test the memory circuit so as to insure the desired operating speed and integrity thereof. One method for accomplishing such integrity testing requires that the circuit be periodically removed from service while a test sequence is set up and executed by the system. This method results in a large percentage of total system time during which the system is removed from normal service. This system-out-of-service or "down" time is minimized by increasing the time period between the periodic tests while the probability of an undetected failure is allowed to increase. A second method for testing a bistable memory circuit is to add a Built In Test (BIT) sub-circuit to the logic system to periodically disconnect the memory circuit and perform an input-to-output signal flow test thereon. During a BIT sequence, a required control intervention will not be acted upon, since the bistable memory circuit is disconnected from the intervention signal generating device. The safety of the logic system is thereby jeopardized, so that the interval between BIT sequences is usually deliberately increased to reduce "down" time.

BRIEF DESCRIPTION OF THE INVENTION

It is desirable to test the integrity of a bistable memory circuit when it is in service in a logic system without causing spurious control interventions, while allowing the circuit output to respond to an effective control intervention output which may appear at any time, including the time during which the test is being made.

In accordance with the invention, a bistable logic circuit realizing these goals while generating a stable output state for activating a circuit load having a known minimum response time includes, in one preferred embodiment, memory means for forming a logic 1 output state in response to a logic 1 setting input thereto and forming a logic zero output state in response to a logic 1 resetting input thereto; first delay means for delaying by a first time period the change of the logic memory means output state to a logic 1; second delay means for delaying by a second time period of longer duration than said first time period only the transition to a logic 1 state of the output of the logic memory means; first logic means for providing an output which is the logic product of the output of the second delay means and the negation of the master reset input; third delay means for delaying by a third time period of duration less than the load response time only the transition to the logic 1 state of the output of the first logic means and second logic means for forming the logic sum of the master set input and the output of the third delay means and coupling this logic sum to the resetting input, the logic memory means and the first delay means, whereby a logic 1 test pulse output having a time duration equal to the third time period is generated in response to a master set input having a duration greater than the first time period but less than the second time period and a logic 1 output is generated for activation of the circuit load in response to a master set input of any time duration greater than the sum of the second and third time periods and maintained until a logic 1 is present solely at the master reset input.

The bistable logic circuit just described has the advantage that it permits in service testing of the circuit without causing spurious interventions and actuations of the circuit load while enabling a response to an effective control intervention input at any time, including that time during which the test is being made.

Accordingly, it is one primary object of the present invention to permit testing of a bistable logic circuit which is installed and in service in a logic system.

Another object of the present invention is to provide a circuit which is adapted to permit such testing without causing the actuation of the bistable logic circuit output load.

A further object is to provide a circuit which permits such testing while allowing an effective control intervention and actuation of the bistable logic circuit output load to be made at any time, including the time during which the test is being made.

It is still a further object of the present invention to provide circuitry to permit such testing.

The above as well as other objects of the invention will become apparent from the following description of the accompanying drawings.

DETAILED DESCRIPTION OF THE INVENTION

Figure 1:
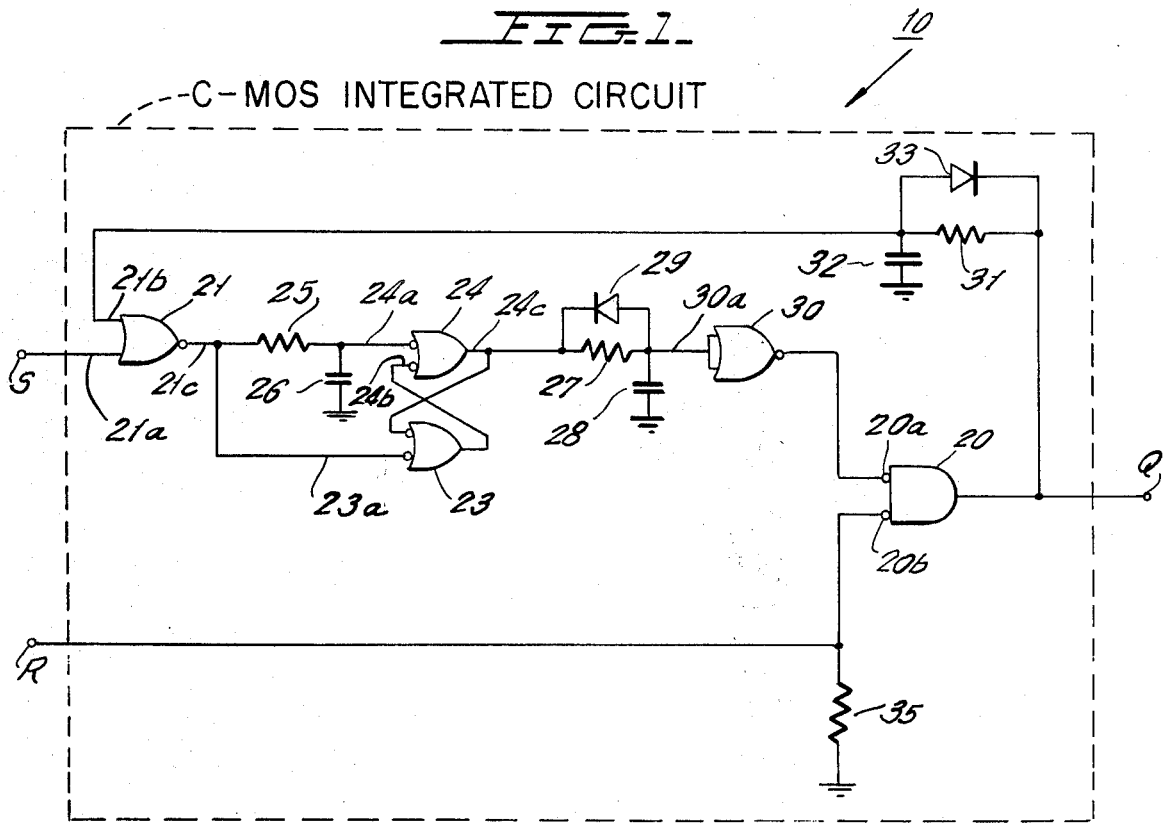
FIG. 1 is a schematic representation of a bistable logic circuit in accordance with the invention.
Figure 2:
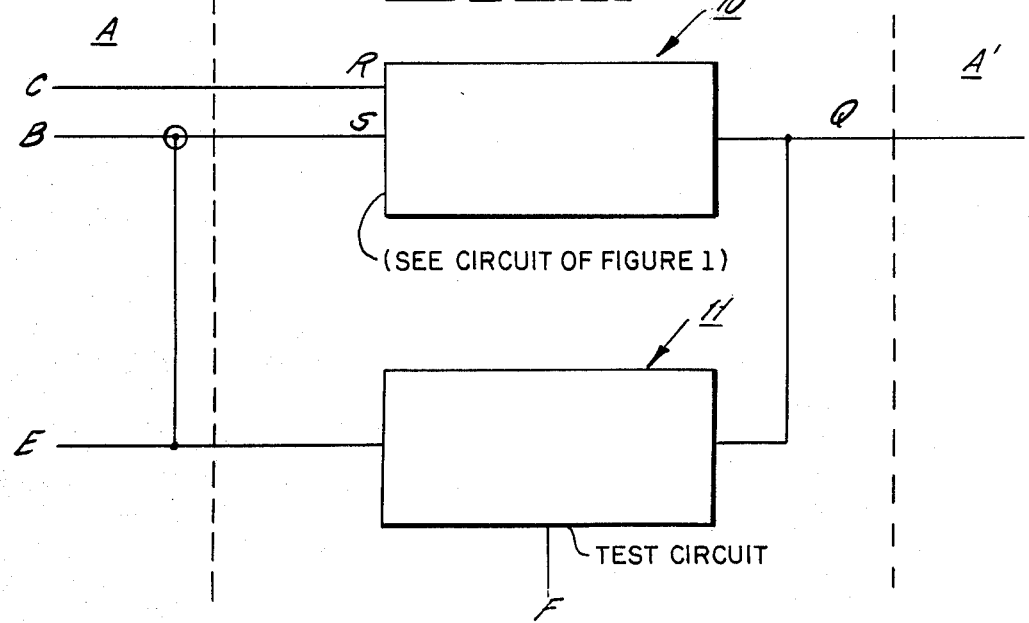
FIG. 2 is a functional block diagram of a bistable logic circuit in accordance with the invention and of the logic system and checking means with which it is used.

Referring to FIG. 2 of the drawings, bistable logic circuit 10 forms an intermediate segment of a general logic system. A prior portion A of this logic system formulates a logic command B to set the output Q of the bistable logic circuit and a second logic command C to reset the output. The output response Q of the flip-flop 10 is connected to a latter portion A' of the logic system to effectuate the desired system response. The bistable logic circuit 10 receives a logic type control signal, characterized by a state defined as "0" and by another state defined as "1". The bistable circuit output signal is also of this logic type. Normally the output and both the set S and reset R inputs of the circuit are in state "0", corresponding to the absence of a response Q and of either command B or C, respectively. Upon the arrival of a command B from the prior system portion A, the circuit input S changes to a logic 1 and after a short delay sets the output Q to logic 1. When the circuit input B returns to the logic 0 state the output Q will stably remain in the set state, i.e., a logic 1, until the appearance of a reset signal C. If the input command C appears as a logic 1 at the reset input R, the bistable circuit output Q will return to the initial condition, a logic 0, only after the cessation of the set input command B. The timer output Q must be in a logic 1 state for at least that period of time required by the latter portion A' of the logic system or the system outputs will not be affected. If the latter portion of the logic system acts upon relays, for example, a circuit output response which does not persist for a period of at least equal to the minimum intervention time of the relay, usually of the order of milliseconds, cannot give rise to an effective actuation of that relay and can be considered effectively non-existent. It is therefore possible to use a test pulse E having a duration shorter than the minimum load response time $T_r$ to check the integrity of various parts of the system without causing spurious or erroneous load actuations.

A test circuit 11, known to the art, compares the test pulse E and the test response of the circuit output Q during a test cycle and develops an alarm signal F if the required response is not present at the required time.

Referring now to all the drawings, a preferred embodiment of the bistable logic circuit utilizes positive logic (state 1 corresponding to the high voltage level) to carry out the sum and negation functions and negative logic (state 0 corresponding to the high voltage level) to carry out the product and memory functions, as shown by the commonly used logic symbols.

Assuming the initial presence of a logic 0 at both the master set input S and the master reset input R, of a logic 1 at one input 20a and of a logic 0 at another input 20b of a logic gate 20, the circuit output Q is thereby a logic 0.

The presence of a normal (i.e. logic 1) input command B applied to the master set input S appears at one input 12a of a NOR gate 21 whose output 21c changes to a logic 0, regardless of the logic state of the second input 21b thereto. A bistable latch comprises cross-coupled NOR gates 23 and 24. The memory resetting signal appearing at the NOR gate output 21c is directly applied to input 23a of gate 23 of the flip-flop and sets the output of that gate and one input 24b of the other gate 24 to a logic 1. A delay generator, formed by charging resistor 25 and delay capacitor 26, prevents the application of the NOR gate output signal 21c to the setting input 24a of the memory flip-flop for a delay period, $T_1$, which delay period is determined by the values of the resistance 25 and the capacitance 26. When the resetting input 23a of gate 23 initially changes to a logic 0, the setting input 24a remains as a logic 1 for the first delay time period $T_1$, and the bistable circuit output 24c also remains as a logic 0 until the setting input 24a has changed to a logic 0, at which time output 24c becomes a logic 1. The memory output 24c is applied to the input of a second, asymmetric delay generator formed by charging resistor 27, capacitor 28 and diode 29. As long as the output 24c of the bistable memory is at logic 0 capacitor 28 is discharged through the forwardly conducting diode 29 and the delay generator output appears at terminal 30a as a logic 0. NOR gate 30 has both of its inputs coupled to terminal 30a and is designed to invert the logic state of the second delay generator output 30a and apply the inverted logic state to input 20a of logic gate 20. When the second delay generator output is a logic 0, inverter 30 applies a logic 1 to the input 20a of the output operator 20 and the output Q is also a logic 0. When the memory circuit output 24c changes to a logic 1, in response to a master set logic 1 input signal applied at input S, diode 29 is reversed-biased and the delay capacitor 28 charges to the logic 1 level through charging resistor 27 after a delay time, $T_2$, is determined by the values of resistance 27 and capacitance 28. Thus, after a total time delay equal to $T_1$ plus $T_2$ input 30a of the negation 30 changes to logic 1, causing the input 20a of the output gate 20 to a logic 0 and the output Q to change to a logic 1. A third, asymmetrical delay generator is formed by charging resistance 31, capacitor 32 and diode 33. A logic 0 at the circuit output Q causes diode 33 to conduct and abruptly discharge capacitor 32 to the logic 0 level, causing the output of the third delay generator to be a logic 0. When the circuit output Q changes to a logic 1 the diode 33 is reverse-biased and the voltage across capacitor 32 reaches the logic 1 level after a time delay period, $T_3$, determined by the value of the resistance 31 and the capacitance 32. The appearance of a logic 1 at the third delay generator output is coupled to the second input 21b of input gate 21 and continues the presence of a logic 0 at the setting input 24a of the memory circuit, thereby insuring that a stable logic 1 will remain present at the circuit output Q, regardless of the logic state of the master set input S thereafter. Therefore, if the normal set command B appears at input S of the bistable logic circuit 10 for a time period longer than the sum of the second and third delays, $T_2 + T_3$, the circuit generates a stable logic 1 output state sufficient to activate a circuit load. The test operation of the circuit is described as follows, assuming the initial and normal operating condition in which the signals S, R and Q are all in the logic 0 state.

It is supposed first that there arrives at the input S a test signal E in the form of a pulse of duration $T_t$, shorter than T2 and longer than $T_1$.

After the time $T_1$ has passed, the set signal arrives at the input 24a of memory gate 24 and the memory output 24c switches to logic 1, even though the reset signal is present at input 23a of memory gate 23, as output 24c is made preferential for the set signal.

After the time $T_t$ has passed, the reset signal at the input 23a of memory gate 23 disappears, while the set signal remains at input 24a of memory gate 24. Therefore, the memory 24c output remains as a logic 1 in a stable manner. After the second time delay $T_2$ has elapsed the output 20a of the second delay generator also changes to logic 1 and therefore the output signal Q also switches to a logic 1 state. It is thus possible to check switching of the output signal Q by effect of a test signal E at the set input S.

It must now be verified that this state is stable, that is, the test signal E having disappeared, that the self-holding system of the bistable circuit functions. To do this it suffices to check that the second logic gate 21 functions to cause the output Q of the circuit itself to replace in function the test signal E which therefore may cease, without causing alterations.

The second part of the test occurs as follows: After a time period $T_3$ of permanence of the signal Q as a logic 1, the input 21b of gate 21 also changes to a logic 1 and therefore, when gate 21 functions its output 21c changes to a logic 0. At this point, while the first delay generator maintains a logic 0 at the set input 24a of memory gate 24 for a time not shorter than $T_1$, the reset input 23a suddenly receives the resetting signal. Therefore the memory output 24c returns to a logic 0 and, since the second and third delay generators give to this switched output a negligible delay, both the output signal Q and the signals present at both inputs 21a and 21b of gate 21 and the resetting signal input 23a of memory gate 23 all return to a logic 0.

In other words, the disappearance of the output signal Q after a time equal to $T_3$ serves to verify the proper operation of the circuit for an actuating signal B at the set input S.

In fact, suppose that an actuating signal B at set input terminal S has a duration greater than $T_2 + T_3$. In this case, the output signal of the third delay generator at input 21b of gate 21 passes to a logic 1 while signal B is still present at input S of the circuit, namely, while the set control is still present at input 24a of memory gate 24. The memory output 24c cannot switch to a logic 0 since it has been seen that the memory output 24c is preferential for the set control. Therefore, a logic 1 is maintained stably in the entire chain of the three delay generators and in particular at the output terminal Q.

The restoration of the circuit output Q to a logic 0 occurs when the reset input terminal R switches from the normal logic 0 to reset input signal C as a logic 1. Gate 20, which has both inputs 20a and 20b functioning in negative logic, allows the output Q to switch to a logic 0. When the signal C then returns to logic 0, the output Q returns to logic 1, but a set input signal B or E being no longer present at the set input S, the circuit behaves as in the second part of the check, that is, after a permanence at a logic 1 level for a time duration equal to $T_3$, the output Q definitely returns to a logic 0 level.

If the latter portion A' of the logic system has a delay time $T_r$ for a response of the end members, to obtain what has been indicated in the objects of the invention it suffices to design the third delay generator so that the delay time $T_3$ is always less than $T_r$. In that case, if $T_3$ is less than $T_2$ and greater than $T_1$, the pulse used as test signal E may have a time duration equal to $T_3$.

As the binary logic circuit is tested by the application of a test pulse E having a short duration, the simultaneous application of a normal intervention signal B at the main set input S will prevent the circuit output Q from returning to a logic 0 after the third delay generator removes the second NOR gate input 21b. Thus, an effective load actuation output Q is obtained at any time by the presence of an actuation input B at the "wired-OR" input connection between the normal input B and the test input E, regardless of the presence of the test signal E.

There has just been described a novel binary logic circuit which can be tested without causing the actuation of the circuit output load, while installed and in service in an equipment logic system and allowing effective control intervention and actuation of the output load to be made at any time, including the time during which the test is being made.

The present invention has been described in connection with a preferred embodiment thereof, many variations and modifications will become apparent to those skilled in the art. It is preferred, therefore, that the present invention be limited not by the specific disclosure herein, but only by the appended claims.

What is claimed is:

1. A bistable binary logic circuit with complete test capability even during normal service, said bistable logic circuit having master set and master reset inputs and a master output, and comprising:

memory means having set and reset inputs and an output;

first gate means having first and second inputs and an output, said second input being coupled to said master reset input, said output being coupled to said master output, for operating a load having a known response time ($T_R$), if said first input is at a second binary level and said master reset input remains at a first binary level;

first asymmetric delay means for coupling the output of said memory means to the first input of said first gate means after a first predetermined delay ($T_1$);

second gate means having first and second inputs and an output, said first input being coupled to said master set input, said output being coupled to said memory means reset input, for generating a resetting signal when at least one of its inputs is at a second binary level;

second asymmetric delay means for coupling said master output signal to the second input of said second gate means after a second predetermined delay ($T_2$);

third delay means for coupling the output of said second gate means to said memory means set input for generating a setting signal after a third predetermined delay ($T_3$);

whereby an input signal of duration ($T_{is}$) applied at a second binary level to said master set input causes the master output to develop said master output signal at a second binary level and remain at the master output signal level if the time interval ($T_{is}$) of the input signal (applied for normal operation) is such that the input signal is still present at the master set input when said second delay means delivers the master output signal to the second input of said second gate means and which causes said master output signal to be only briefly maintained if the time interval $T_{is}$ of the input signal (applied for test purposes) is such that the input signal is removed before the second delay means delivers the master output signal to the second input of said second gate means.

2. The device of claim 1, wherein the delay period $T_2$ of said second means is less than the response time $T_R$ of the load so that short input signals applied to the device set input for test purposes cause the device output signal to be sustained for a duration no greater than $T_2$, whereby the presence of the output signal during time interval $T_2$ assures reliable operation of the device while preventing operation of the load connected thereto.

3. The device of claim 1, wherein the first asymmetric delay means comprises:
 a first R-C timing circuit which charges whenever said output of said memory means is at a second binary level; and
 a diode coupled to said auxiliary memory output and said first R-C timing circuit for initiating abrupt discharge thereof whenever said output of said memory means is at a first binary level.

4. The device of claim 3, wherein the first delay means further comprises a first gating element having an input and an output, said first gating element input being coupled to the output of said first R-C timing circuit, said first gating element being adapted to generate a signal at its output which is the negation of a signal at said first timing circuit output.

5. The device of claim 1, wherein the second asymmetric delay means comprises:
 a second R-C timing circuit which charges whenever said master output is at a second binary level; and
 a diode coupled to said master output and said second timing circuit for initiating abrupt discharge thereof whenever said master output is at a first binary level.

6. The device of claim 1, wherein the third delay means comprises a third R-C timing circuit which charges whenever said output of said second gating means is at a second binary level and which discharges whenever said output of said second gate means is at a first binary level.

7. The device of claim 1, wherein said memory means comprises two NOR (negative logic) gates interconnected as a Set-Reset latch, whose set-preferring output is coupled to said memory means output.

8. The device of claim 4, wherein the first gate means comprises a second gating element having first and second inputs and an output, said second gating element output being generated as a binary signal which is a logic product of a negation of a first signal at said second gating element first input and a negation of a second signal at said second gating element second input.

9. The device of claim 8, wherein the second gate means comprises a third gating element having first and second inputs and an output, said third gating element output being generated as a binary signal which is a negation of a logic sum of a third signal at said third gating element first input and a fourth signal at said third gating element second input.

10. The device of claim 9, wherein said first, second, and third gating elements and said means memory comprise at least one integrated circuit.

11. The device of claim 10, wherein the integrated circuit is of the complementary-MOS type.

* * * * *